US010347315B2

(12) United States Patent
Reusswig et al.

(10) Patent No.: US 10,347,315 B2
(45) Date of Patent: Jul. 9, 2019

(54) GROUP READ REFRESH

(71) Applicant: SanDisk Technologies LLC, Plano, TX (US)

(72) Inventors: Philip David Reusswig, Mountain View, CA (US); Grishma Shah, Milpitas, CA (US); Nian Niles Yang, Mountain View, CA (US)

(73) Assignee: SanDisk Technologies LLC, Addison, TX (US)

( * ) Notice: Subject to any disclaimer, the term of this patent is extended or adjusted under 35 U.S.C. 154(b) by 0 days.

(21) Appl. No.: 15/800,023

(22) Filed: Oct. 31, 2017

(65) Prior Publication Data
US 2019/0130964 A1 May 2, 2019

(51) Int. Cl.
G11C 7/00 (2006.01)
G11C 11/406 (2006.01)
G11C 29/00 (2006.01)
G11C 11/4091 (2006.01)

(52) U.S. Cl.
CPC .... G11C 11/40618 (2013.01); G11C 11/4091 (2013.01); G11C 11/40603 (2013.01); G11C 29/783 (2013.01)

(58) Field of Classification Search
CPC ........ G11C 11/40618; G11C 11/40603; G11C 11/4091
USPC ............................................. 365/222, 230.03
See application file for complete search history.

(56) References Cited

U.S. PATENT DOCUMENTS

| 5,168,463 A | 12/1992 | Ikeda et al. |
| 5,491,809 A | 2/1996 | Coffman et al. |
| 5,555,527 A | 9/1996 | Kotani et al. |
| 6,343,033 B1 | 1/2002 | Parker |
| 6,751,146 B1 | 6/2004 | Wang |
| 6,831,865 B2 | 12/2004 | Chang et al. |
| 7,161,837 B2 | 1/2007 | Park |
| 7,180,786 B2 | 2/2007 | Mastrangelo et al. |
| 7,408,811 B2 | 8/2008 | Shirota |
| 7,450,421 B2 | 11/2008 | Mokhlesi et al. |
| 7,508,714 B2 | 3/2009 | Fasoli |
| 7,821,832 B2 | 10/2010 | Hahn |
| 7,974,134 B2 | 7/2011 | Zhang et al. |
| 8,085,616 B2 | 12/2011 | Ryu |
| 8,156,398 B2 | 4/2012 | Sommer |
| 8,199,567 B2 | 6/2012 | Chang-Wook et al. |
| 8,406,053 B1 | 3/2013 | Dutta |

(Continued)

OTHER PUBLICATIONS

U.S. Appl. No. 15/451,186 Non-Final Rejection dated Nov. 16, 2017.

(Continued)

*Primary Examiner* — Vu A Le
(74) *Attorney, Agent, or Firm* — Vierra Magen Marcus LLP

(57) ABSTRACT

Apparatuses, systems, methods, and computer program products are disclosed for performing a group read refresh. An apparatus includes a plurality of memory groups. An apparatus includes an operation circuit that performs an operation on a selected memory group of a plurality of memory groups. An apparatus includes a remediation circuit that performs a countermeasure operation on an unselected memory group of a plurality of memory groups in response to an operation on a selected memory group.

19 Claims, 10 Drawing Sheets

(56) References Cited

U.S. PATENT DOCUMENTS

| | | | |
|---|---|---|---|
| 8,432,733 B2 | 4/2013 | Higashitani | |
| 8,472,266 B2 | 6/2013 | Khandelwal et al. | |
| 8,482,986 B2 | 7/2013 | Yamada | |
| 8,576,624 B2 | 11/2013 | Dutta | |
| 8,677,221 B2 | 3/2014 | Cornwell et al. | |
| 8,687,421 B2 | 4/2014 | Avila et al. | |
| 8,711,634 B2 | 4/2014 | Futatsuyama et al. | |
| 8,732,537 B2 | 5/2014 | Zhang et al. | |
| 8,792,274 B1 | 7/2014 | Tang et al. | |
| 8,885,412 B2 | 11/2014 | Li | |
| 8,902,668 B1 | 12/2014 | Dutta et al. | |
| 8,908,441 B1 | 12/2014 | Dutta et al. | |
| 9,001,579 B2* | 4/2015 | Song | G11C 7/04 365/185.03 |
| 9,007,814 B1 | 4/2015 | Derhacobian | |
| 9,053,765 B2 | 6/2015 | Fukano | |
| 9,082,486 B2 | 7/2015 | Yang | |
| 9,123,389 B1 | 9/2015 | Park | |
| 9,136,003 B1 | 9/2015 | Meir et al. | |
| 9,230,663 B1 | 1/2016 | Lu et al. | |
| 9,275,730 B2 | 3/2016 | Tortorelli et al. | |
| 9,275,737 B2 | 3/2016 | Maejima | |
| 9,324,439 B1 | 4/2016 | Chen et al. | |
| 9,378,830 B2 | 6/2016 | Khoueir | |
| 9,412,463 B1 | 8/2016 | Chen | |
| 9,418,743 B1 | 8/2016 | Chen | |
| 9,443,606 B2 | 9/2016 | Dutta et al. | |
| 9,607,707 B1 | 3/2017 | Pang | |
| 9,620,233 B1 | 4/2017 | Dong et al. | |
| 9,711,231 B1 | 7/2017 | Yip et al. | |
| 9,715,937 B1 | 7/2017 | Pang et al. | |
| 9,721,671 B2 | 8/2017 | Chu | |
| 9,830,994 B1 | 11/2017 | Mitsuhira et al. | |
| 9,911,500 B2 | 3/2018 | Pang et al. | |
| 9,952,944 B1 | 4/2018 | Alrod et al. | |
| 10,026,486 B1 | 7/2018 | Dutta et al. | |
| 2003/0085731 A1 | 5/2003 | Iwase et al. | |
| 2005/0195304 A1 | 9/2005 | Nitta et al. | |
| 2007/0183242 A1 | 8/2007 | Miyamoto | |
| 2009/0052255 A1 | 2/2009 | Moon et al. | |
| 2009/0316489 A1 | 12/2009 | Han | |
| 2010/0027314 A1 | 2/2010 | Chevallier | |
| 2010/0074026 A1 | 3/2010 | Kang | |
| 2011/0026331 A1 | 2/2011 | Dong et al. | |
| 2011/0032746 A1 | 2/2011 | Maejima et al. | |
| 2011/0069529 A1 | 3/2011 | Srinivasan et al. | |
| 2011/0128782 A1 | 6/2011 | Goda et al. | |
| 2011/0305089 A1 | 12/2011 | Abe et al. | |
| 2012/0221913 A1 | 8/2012 | Anholt et al. | |
| 2012/0257453 A1 | 10/2012 | Shiino et al. | |
| 2012/0287720 A1 | 11/2012 | Choi | |
| 2013/0070524 A1 | 3/2013 | Dutta et al. | |
| 2013/0135008 A1 | 5/2013 | Zhang et al. | |
| 2013/0148425 A1 | 6/2013 | Dutta | |
| 2013/0235649 A1 | 9/2013 | Lindstadt | |
| 2014/0098593 A1 | 4/2014 | Calderoni et al. | |
| 2014/0119101 A1 | 5/2014 | Wang et al. | |
| 2014/0140148 A1 | 5/2014 | An | |
| 2014/0198594 A1 | 7/2014 | McCombs | |
| 2014/0269069 A1 | 9/2014 | D'Abreu et al. | |
| 2014/0346320 A1 | 11/2014 | Sohn | |
| 2014/0355340 A1 | 12/2014 | Sharon et al. | |
| 2015/0023097 A1 | 1/2015 | Khoueir et al. | |
| 2015/0092488 A1 | 4/2015 | Wakchaure et al. | |
| 2015/0364185 A1 | 12/2015 | Yoo | |
| 2016/0071601 A1 | 3/2016 | Shirakawa et al. | |
| 2016/0098216 A1 | 4/2016 | Huang et al. | |
| 2016/0118129 A1 | 4/2016 | Muchherla et al. | |
| 2016/0118135 A1 | 4/2016 | Dutta et al. | |
| 2016/0141301 A1 | 5/2016 | Mokhlesi et al. | |
| 2016/0155490 A1* | 6/2016 | Shin | G11C 11/4085 365/203 |
| 2016/0172045 A1 | 6/2016 | Shukla et al. | |
| 2016/0203873 A1 | 7/2016 | Kuribara et al. | |
| 2017/0154680 A1* | 6/2017 | Lee | G11C 16/10 |
| 2017/0236595 A1 | 8/2017 | Maejima et al. | |
| 2018/0114580 A1 | 4/2018 | Alrod et al. | |
| 2018/0203762 A1 | 7/2018 | Alrod et al. | |
| 2018/0203763 A1 | 7/2018 | Alrod et al. | |
| 2018/0217893 A1* | 8/2018 | Hung | G06F 11/1044 |

OTHER PUBLICATIONS

U.S. Appl. No. 15/440,185 Non-Final Rejection dated Dec. 22, 2017.
U.S. Appl. No. 15/440,185 Final Rejection dated May 25, 2018.
U.S. Appl. No. 15/131,392 Non-Final Rejection dated Sep. 28, 2016.
U.S. Appl. No. 15/131,392 Non-Final Rejection dated Jun. 8, 2017.
U.S. Appl. No. 15/131,392 Notice of Allowance dated Nov. 1, 2017.
U.S. Appl. No. 15/191,898 Non-Final Rejection dated Nov. 2, 2016.
U.S. Appl. No. 15/191,898 Notice of Allowance dated Mar. 10, 2017.
U.S. Appl. No. 15/1422,803 Notice of Allowance dated Aug. 16, 2017.
U.S. Appl. No. 15/333,440 Non-Final Rejection dated Aug. 9, 2017.
U.S. Appl. No. 15/333,440 Notice of Allowance dated Dec. 11, 2017.
Cai, Yu, et al. "Threshold Voltage Distribution in MLC NAND Flash Memory Characterization, Analysis, and Modeling," Proceedings of the Conference on Design, Automation and Test, Mar. 2016, 6 pages.
U.S. Appl. No. 15/451,186 Notice of Allowance dated Mar. 26, 2018.
PCT International Patent Application No. PCT/US2017/050568 International Search Report and Written Opinion dated Dec. 11, 2017.
Wolf, Jack Keil, "An Introduction to Error Correcting Codes: Part 3,": ECE 154C, Powerpoint, May 2010, 41 pages.
Sommer, Naftali, PhD., "Signal processing and the evolution of NAND flash memory," Embedded Computing Design, vol. 8, No. 8, Dec. 2010, 2 pages.

* cited by examiner

GROUP READ REFRESH

TECHNICAL FIELD

The present disclosure, in various embodiments, relates to memory and more particularly relates to performing a group read refresh on memory blocks.

BACKGROUND

Many electrical circuits and devices, such as memory devices or the like, may be organized in blocks or groups. In certain configurations, data read from a memory device may have data errors if blocks or groups of memory cells have been disturbed, or are in an unexpected state.

SUMMARY

Apparatuses are presented for performing a group read refresh. In one embodiment, an apparatus includes a plurality of memory groups. An apparatus, in certain embodiments, includes an operation circuit that performs an operation on a selected memory group of a plurality of memory groups. An apparatus, in some embodiments, includes a remediation circuit that performs a countermeasure operation on an unselected memory group of a plurality of memory groups in response to an operation on a selected memory group.

Systems are presented for performing a group read refresh. A system, in one embodiment, includes a plurality of memory blocks coupled to the same control line. In various embodiments, a system includes a controller. In a further embodiment, a controller is configured to perform an operation on a selected memory block of a plurality of memory blocks; determine a type of read refresh to perform; and as part of the operation, perform the type of read refresh on an unselected memory block of the plurality of memory blocks.

An apparatus for performing a group read refresh, in one embodiment, includes means for performing an operation on a selected group of memory cells of a plurality of memory cells using an operation voltage level for the selected group of memory cells and a different voltage level for an unselected group of memory cells of the plurality of memory cells. In some embodiments, an apparatus includes means for performing a read refresh on an unselected group of memory cells of a plurality of memory cells in response to completing an operation.

BRIEF DESCRIPTION OF THE DRAWINGS

A more particular description is included below with reference to specific embodiments illustrated in the appended drawings. Understanding that these drawings depict only certain embodiments of the disclosure and are not therefore to be considered to be limiting of its scope, the disclosure is described and explained with additional specificity and detail through the use of the accompanying drawings, in which.

DETAILED DESCRIPTION

Figure 1A:
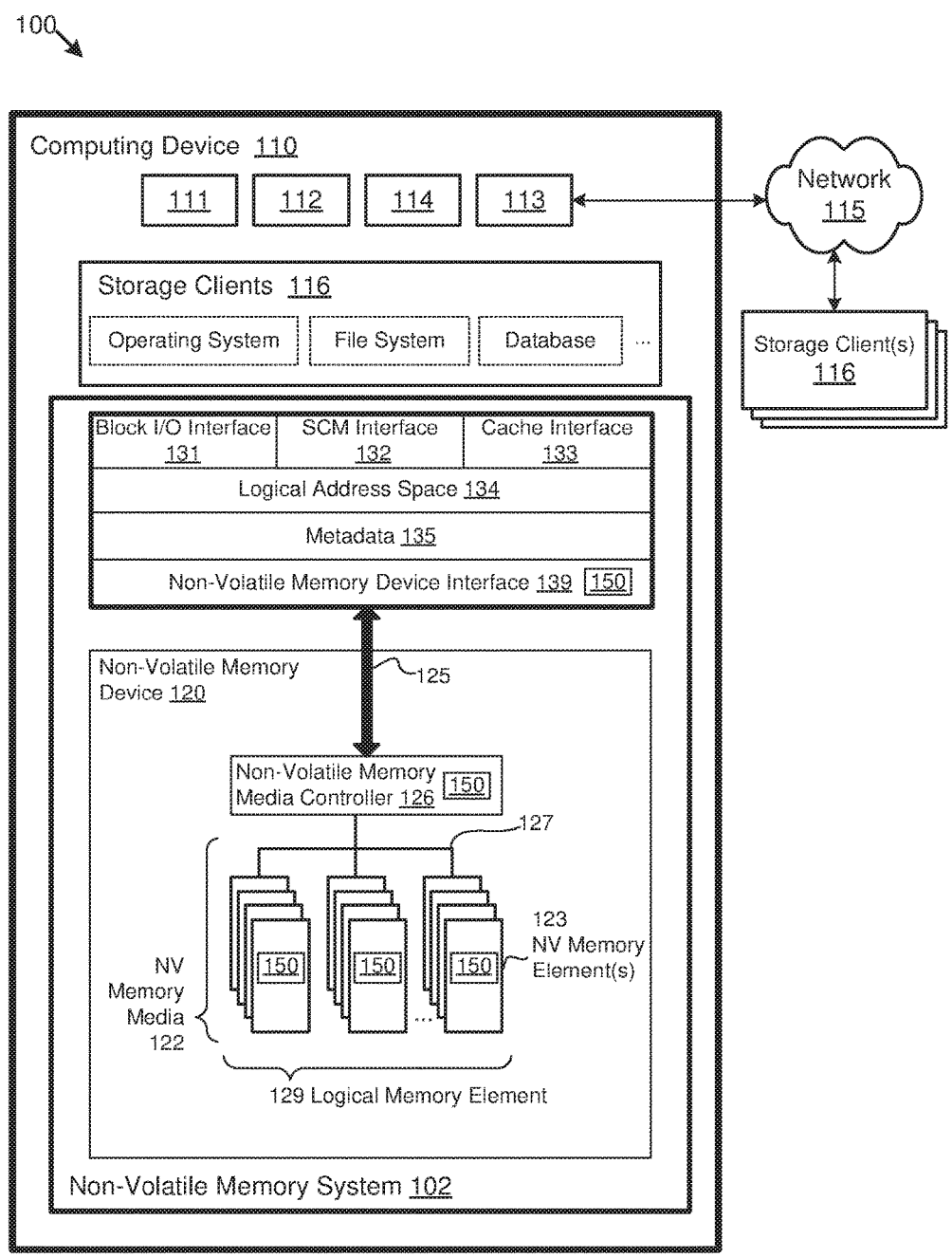
FIG. 1A is a schematic block diagram illustrating one embodiment of a system for performing a group read refresh.

Aspects of the present disclosure may be embodied as an apparatus, system, method, or computer program product. Accordingly, aspects of the present disclosure may take the form of an entirely hardware embodiment, an entirely software embodiment (including firmware, resident software, micro-code, or the like) or an embodiment combining software and hardware aspects that may all generally be referred to herein as a "circuit," "module," "apparatus," or "system." Furthermore, aspects of the present disclosure may take the form of a computer program product embodied in one or more non-transitory computer readable storage media storing computer readable and/or executable program code.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices, or the like.

Modules may also be implemented at least partially in software for execution by various types of processors. An identified module of executable code may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of executable code may include a single instruction, or many instructions, and may even be distributed over several different code segments, among different programs, across several memory devices, or the like. Where a module or portions of a module are implemented in software, the software portions may be stored on one or more computer readable and/or executable storage media. Any combination of one or more computer readable storage media may be utilized. A computer readable storage medium may include, for example, but not limited to, an electronic, magnetic, optical, electromagnetic, infrared, or semiconductor system, apparatus, or device, or any suitable combination of the foregoing, but would not include propagating signals. In the context of this document, a computer readable and/or executable storage medium may be any tangible and/or non-transitory medium that may contain or store a program for use by or in connection with an instruction execution system, apparatus, processor, or device.

Computer program code for carrying out operations for aspects of the present disclosure may be written in any combination of one or more programming languages, including an object oriented programming language such as Python, Java, Smalltalk, C++, C#, Objective C, or the like, conventional procedural programming languages, such as the "C" programming language, scripting programming languages, and/or other similar programming languages. The program code may execute partly or entirely on one or more of a user's computer and/or on a remote computer or server over a data network or the like.

A component, as used herein, comprises a tangible, physical, non-transitory device. For example, a component may be implemented as a hardware logic circuit comprising custom VLSI circuits, gate arrays, or other integrated circuits; off-the-shelf semiconductors such as logic chips, transistors, or other discrete devices; and/or other mechanical or electrical devices. A component may also be implemented in programmable hardware devices such as field programmable gate arrays, programmable array logic, programmable logic devices, or the like. A component may comprise one or more silicon integrated circuit devices (e.g., chips, die, die planes, packages) or other discrete electrical devices, in electrical communication with one or more other components through electrical lines of a printed circuit board (PCB) or the like. Each of the modules described herein, in certain embodiments, may alternatively be embodied by or implemented as a component.

Reference throughout this specification to "one embodiment," "an embodiment," or similar language means that a particular feature, structure, or characteristic described in connection with the embodiment is included in at least one embodiment of the present disclosure. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Aspects of the present disclosure are described below with reference to schematic flowchart diagrams and/or schematic block diagrams of methods, apparatuses, systems, and computer program products according to embodiments of the disclosure. It will be understood that each block of the schematic flowchart diagrams and/or schematic block diagrams, and combinations of blocks in the schematic flowchart diagrams and/or schematic block diagrams, can be implemented by computer program instructions. These computer program instructions may be provided to a processor of a computer or other programmable data processing apparatus to produce a machine, such that the instructions, which execute via the processor or other programmable data processing apparatus, create means for implementing the functions and/or acts specified in the schematic flowchart diagrams and/or schematic block diagrams block or blocks.

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated figures.

Although various arrow types and line types may be employed in the flowchart and/or block diagrams, they are understood not to limit the scope of the corresponding embodiments. For instance, an arrow may indicate a waiting or monitoring period of unspecified duration between enumerated steps of the depicted embodiment.

In the following detailed description, reference is made to the accompanying drawings, which form a part thereof. The foregoing summary is illustrative only and is not intended to be in any way limiting. In addition to the illustrative aspects, embodiments, and features described above, further aspects, embodiments, and features will become apparent by reference to the drawings and the following detailed description. The description of elements in each figure may refer to elements of proceeding figures. Like numbers may refer to like elements in the figures, including alternate embodiments of like elements.

FIG. 1A is a block diagram of one embodiment of a system 100 comprising a group refresh component 150 for a non-volatile memory device 120. The group refresh component 150 may be part of and/or in communication with a non-volatile memory media controller 126, a non-volatile memory element 123, a device driver, or the like. The group refresh component 150 may operate on a non-volatile memory system 102 of a computing device 110, which may comprise a processor 111, volatile memory 112, and a communication interface 113. The processor 111 may comprise one or more central processing units, one or more general-purpose processors, one or more application-specific processors, one or more virtual processors (e.g., the computing device 110 may be a virtual machine operating within a host), one or more processor cores, or the like. The communication interface 113 may comprise one or more network interfaces configured to communicatively couple the computing device 110 and/or non-volatile memory controller 126 to a communication network 115, such as an Internet Protocol (IP) network, a Storage Area Network (SAN), wireless network, wired network, or the like.

The non-volatile memory device 120, in various embodiments, may be disposed in one or more different locations relative to the computing device 110. In one embodiment, the non-volatile memory device 120 comprises one or more non-volatile memory elements 123, such as semiconductor chips or packages or other integrated circuit devices disposed on one or more printed circuit boards, storage housings, and/or other mechanical and/or electrical support structures. For example, the non-volatile memory device 120 may comprise one or more direct inline memory module (DIMM) cards, one or more expansion cards and/or daughter cards, a solid-state-drive (SSD) or other hard drive device, and/or may have another memory and/or storage form factor. The non-volatile memory device 120 may be integrated with and/or mounted on a motherboard of the computing device 110, installed in a port and/or slot of the computing device 110, installed on a different computing device 110 and/or a dedicated storage appliance on the network 115, in communication with the computing device 110 over an external bus (e.g., an external hard drive), or the like.

The non-volatile memory device 120, in one embodiment, may be disposed on a memory bus of a processor 111 (e.g., on the same memory bus as the volatile memory 112, on a different memory bus from the volatile memory 112, in place of the volatile memory 112, or the like). In a further embodiment, the non-volatile memory device 120 may be disposed on a peripheral bus of the computing device 110, such as a peripheral component interconnect express (PCI Express or PCIe) bus, a serial Advanced Technology Attachment (SATA) bus, a parallel Advanced Technology Attachment (PATA) bus, a small computer system interface (SCSI) bus, a FireWire bus, a Fibre Channel connection, a Universal Serial Bus (USB), a PCIe Advanced Switching (PCIe-AS) bus, or the like. In another embodiment, the non-volatile memory device 120 may be disposed on a data network 115, such as an Ethernet network, an Infiniband network, SCSI RDMA over a network 115, a storage area network (SAN), a local area network (LAN), a wide area network (WAN) such as the Internet, another wired and/or wireless network 115, or the like.

The computing device 110 may further comprise a non-transitory, computer readable storage medium 114. The computer readable storage medium 114 may comprise executable instructions configured to cause the computing device 110 (e.g., processor 111) to perform steps of one or more of the methods disclosed herein. Alternatively, or in addition, the group refresh component 150 may be embodied as one or more computer readable instructions stored on the non-transitory storage medium 114.

The non-volatile memory system 102, in the depicted embodiment, includes a group refresh component 150. The group refresh component 150, in one embodiment, is configured to perform an operation on a selected memory group of a plurality of memory groups of the non-volatile memory device 120 (e.g., a plurality of memory blocks) described below. In some embodiments, performing the operation on the selected memory group may place an unselected memory group in a different read state than the selected memory group (e.g., place the unselected memory group in a first read state). The group refresh component 150, in certain embodiments, may perform a read on the unselected memory group of the plurality of memory groups in response to the operation on the selected memory group. As a result of the read on the unselected memory group, the unselected memory group may be transitioned to a same read state as the selected memory group (e.g., transitioned from a first read state to a second read state).

As used herein, a memory block may refer to a group, set, and/or subset of non-volatile memory elements 123, memory cells, and/or storage elements. For example, a memory block may comprise an erase block or other set of cells that are accessible together for one or more operations. Furthermore, as used herein, a memory group may refer to a group, set, and/or subset of non-volatile memory elements 123, memory cells, and/or storage elements. In certain embodiments, a memory group may comprise multiple memory blocks with a common control line, common passing gate, common row decoder, or the like (e.g., to conserve circuit space of a memory element 123 or the like).

In one embodiment, the group refresh component 150 may comprise logic hardware of one or more non-volatile memory devices 120, such as a non-volatile memory media controller 126, a non-volatile memory element 123, a device controller, a field-programmable gate array (FPGA) or other programmable logic, firmware for an FPGA or other programmable logic, microcode for execution on a microcontroller, an application-specific integrated circuit (ASIC), or the like. In another embodiment, the group refresh component 150 may comprise executable software code, such as a device driver or the like, stored on the computer readable storage medium 114 for execution on the processor 111. In a further embodiment, the group refresh component 150 may include a combination of both executable software code and logic hardware.

FIG. 1A illustrates the group refresh component 150 comprising multiple separate components to illustrate that the group refresh component 150 may be entirely in one or more components of FIG. 1A and/or partially within one or more components of FIG. 1A. For example, the entire group refresh component 150 may be part of the non-volatile memory elements 123, the non-volatile memory medial controller 126, and/or the non-volatile memory device interface 139. As another example, portions of the group refresh component 150 may be part of the non-volatile memory elements 123, the non-volatile memory medial controller 126, and/or the non-volatile memory device interface 139. It should be noted that the group refresh component 150 may be in only one of the illustrated components and/or the group refresh component 150 may be in components of FIG. 1A that do not illustrate the group refresh component 150 therein.

In one embodiment, the group refresh component 150 is configured to receive storage requests from a device driver or other executable application via a bus 125 or the like. The group refresh component 150 may be further configured to transfer data to/from a device driver and/or storage clients 116 via the bus 125. Accordingly, the group refresh component 150, in some embodiments, may comprise and/or be in communication with one or more direct memory access (DMA) modules, remote DMA modules, bus controllers, bridges, buffers, and so on to facilitate the transfer of storage requests and associated data. In another embodiment, the group refresh component 150 may receive storage requests as an API call from a storage client 116, as an IO-CTL command, or the like.

According to various embodiments, a non-volatile memory controller 126 in communication with one or more group refresh components 150 may manage one or more non-volatile memory devices 120 and/or non-volatile memory elements 123. The non-volatile memory device(s) 120 may comprise recording, memory, and/or storage devices, such as solid-state storage device(s) and/or semiconductor storage device(s) that are arranged and/or partitioned into a plurality of addressable media storage locations. As used herein, a media storage location refers to any physical unit of memory (e.g., any quantity of physical storage media on a non-volatile memory device 120). Memory units may include, but are not limited to: pages, memory divisions, blocks, sectors, collections or sets of physical storage locations (e.g., logical pages, logical blocks), or the like.

A device driver and/or the non-volatile memory media controller 126, in certain embodiments, may present a logical address space 134 to the storage clients 116. As used herein, a logical address space 134 refers to a logical representation of memory resources. The logical address space 134 may comprise a plurality (e.g., range) of logical addresses. As used herein, a logical address refers to any identifier for referencing a memory resource (e.g., data), including, but not limited to: a logical block address (LBA), cylinder/head/sector (CHS) address, a file name, an object identifier, an inode, a Universally Unique Identifier (UUID), a Globally Unique Identifier (GUID), a hash code, a signature, an index entry, a range, an extent, or the like.

A device driver for the non-volatile memory device 120 may maintain metadata 135, such as a logical to physical address mapping structure, to map logical addresses of the logical address space 134 to media storage locations on the non-volatile memory device(s) 120. A device driver may be configured to provide storage services to one or more storage clients 116. The storage clients 116 may include local storage clients 116 operating on the computing device 110 and/or remote, storage clients 116 accessible via the network 115 and/or network interface 113. The storage clients 116 may include, but are not limited to: operating systems, file systems, database applications, server applications, kernel-level processes, user-level processes, applications, and the like.

A device driver may be communicatively coupled to one or more non-volatile memory devices 120. The one or more non-volatile memory devices 120 may include different types of non-volatile memory devices including, but not limited to: solid-state storage devices, semiconductor storage devices, SAN storage resources, or the like. The one or more non-volatile memory devices 120 may comprise one or more respective non-volatile memory media controllers 126 and non-volatile memory media 122. A device driver may provide access to the one or more non-volatile memory devices 120 via a traditional block I/O interface 131. Additionally, a device driver may provide access to enhanced functionality through the SCM interface 132. The metadata 135 may be used to manage and/or track data operations performed through any of the Block I/O interface 131, SCM interface 132, cache interface 133, or other, related interfaces.

The cache interface 133 may expose cache-specific features accessible via a device driver for the non-volatile memory device 120. Also, in some embodiments, the SCM interface 132 presented to the storage clients 116 provides access to data transformations implemented by the one or more non-volatile memory devices 120 and/or the one or more non-volatile memory media controllers 126.

A device driver may present a logical address space 134 to the storage clients 116 through one or more interfaces. As discussed above, the logical address space 134 may comprise a plurality of logical addresses, each corresponding to respective media locations of the one or more non-volatile memory devices 120. A device driver may maintain metadata 135 comprising any-to-any mappings between logical addresses and media locations, or the like.

A device driver may further comprise and/or be in communication with a non-volatile memory device interface 139 configured to transfer data, commands, and/or queries to the one or more non-volatile memory devices 120 over a bus 125, which may include, but is not limited to: a memory bus of a processor 111, a peripheral component interconnect express (PCI Express or PCIe) bus, a serial Advanced Technology Attachment (ATA) bus, a parallel ATA bus, a small computer system interface (SCSI), FireWire, Fibre Channel, a Universal Serial Bus (USB), a PCIe Advanced Switching (PCIe-AS) bus, a network 115, Infiniband, SCSI RDMA, or the like. The non-volatile memory device interface 139 may communicate with the one or more non-volatile memory devices 120 using input-output control (IO-CTL) command(s), IO-CTL command extension(s), remote direct memory access, or the like.

The communication interface 113 may comprise one or more network interfaces configured to communicatively couple the computing device 110 and/or the non-volatile memory controller 126 to a network 115 and/or to one or more remote, network-accessible storage clients 116. The storage clients 116 may include local storage clients 116 operating on the computing device 110 and/or remote, storage clients 116 accessible via the network 115 and/or the network interface 113. The non-volatile memory controller 126 is part of and/or in communication with one or more non-volatile memory devices 120. Although FIG. 1A depicts a single non-volatile memory device 120, the disclosure is not limited in this regard and could be adapted to incorporate any number of non-volatile memory devices 120.

The non-volatile memory device 120 may comprise one or more elements 123 of non-volatile memory media 122, which may include but is not limited to: ReRAM, Memristor memory, programmable metallization cell memory, phase-change memory (PCM, PCME, PRAM, PCRAM, ovonic unified memory, chalcogenide RAM, or C-RAM), NAND flash memory (e.g., 2D NAND flash memory, 3D NAND flash memory), NOR flash memory, nano random access memory (nano RAM or NRAM), nanocrystal wire-based memory, silicon-oxide based sub-10 nanometer process memory, graphene memory, Silicon-Oxide-Nitride-Oxide-Silicon (SONOS), programmable metallization cell (PMC), conductive-bridging RAM (CBRAM), magneto-resistive RAM (MRAM), magnetic storage media (e.g., hard disk, tape), optical storage media, or the like. The one or more elements 123 of non-volatile memory media 122, in certain embodiments, comprise storage class memory (SCM).

While legacy technologies such as NAND flash may be block and/or page addressable, storage class memory, in one embodiment, is byte addressable. In further embodiments, storage class memory may be faster and/or have a longer life (e.g., endurance) than NAND flash; may have a lower cost, use less power, and/or have a higher storage density than DRAM; or offer one or more other benefits or improvements when compared to other technologies. For example, storage class memory may comprise one or more non-volatile memory elements 123 of ReRAM, Memristor memory, programmable metallization cell memory, phase-change memory, nano RAM, nanocrystal wire-based memory, silicon-oxide based sub-10 nanometer process memory, graphene memory, SONOS memory, PMC memory, CBRAM, MRAM, and/or variations thereof.

While the non-volatile memory media 122 is referred to herein as "memory media," in various embodiments, the non-volatile memory media 122 may more generally comprise one or more non-volatile recording media capable of recording data, which may be referred to as a non-volatile memory medium, a non-volatile storage medium, or the like. Further, the non-volatile memory device 120, in various embodiments, may comprise a non-volatile recording device, a non-volatile memory device, a non-volatile storage device, or the like.

The non-volatile memory media 122 may comprise one or more non-volatile memory elements 123, which may include, but are not limited to: chips, packages, planes, die, or the like. A non-volatile memory media controller 126 may be configured to manage data operations on the non-volatile memory media 122, and may comprise one or more processors, programmable processors (e.g., FPGAs), ASICs, micro-controllers, or the like. In some embodiments, the non-volatile memory media controller 126 is configured to store data on and/or read data from the non-volatile memory media 122, to transfer data to/from the non-volatile memory device 120, and so on.

The non-volatile memory media controller 126 may be communicatively coupled to the non-volatile memory media 122 by way of a bus 127. The bus 127 may comprise an I/O bus for communicating data to/from the non-volatile memory elements 123. The bus 127 may further comprise a control bus for communicating addressing and other command and control information to the non-volatile memory elements 123. In some embodiments, the bus 127 may communicatively couple the non-volatile memory elements 123 to the non-volatile memory media controller 126 in parallel. This parallel access may allow the non-volatile memory elements 123 to be managed as a group, forming a logical memory element 129. The logical memory element may be partitioned into respective logical memory units (e.g., logical pages) and/or logical memory divisions (e.g., logical blocks). The logical memory units may be formed by logically combining physical memory units of each of the non-volatile memory elements.

The non-volatile memory controller 126 may organize a block of word lines within a non-volatile memory element 123, in certain embodiments, using addresses of the word lines, such that the word lines are logically organized into a monotonically increasing sequence (e.g., decoding and/or translating addresses for word lines into a monotonically increasing sequence, or the like). In a further embodiment, word lines of a block within a non-volatile memory element 123 may be physically arranged in a monotonically increasing sequence of word line addresses, with consecutively addressed word lines also being physically adjacent (e.g., WL0, WL1, WL2, . . . WLN).

The non-volatile memory controller 126 may comprise and/or be in communication with a device driver executing on the computing device 110. A device driver may provide storage services to the storage clients 116 via one or more interfaces 131, 132, and/or 133. In some embodiments, a device driver provides a block-device I/O interface 131 through which storage clients 116 perform block-level I/O operations. Alternatively, or in addition, a device driver may provide a storage class memory (SCM) interface 132, which may provide other storage services to the storage clients 116. In some embodiments, the SCM interface 132 may comprise extensions to the block device interface 131 (e.g., storage clients 116 may access the SCM interface 132 through extensions or additions to the block device interface 131). Alternatively, or in addition, the SCM interface 132 may be provided as a separate API, service, and/or library. A device driver may be further configured to provide a cache interface 133 for caching data using the non-volatile memory system 102.

A device driver may further comprise a non-volatile memory device interface 139 that is configured to transfer data, commands, and/or queries to the non-volatile memory media controller 126 over a bus 125, as described above.

Figure 1B:
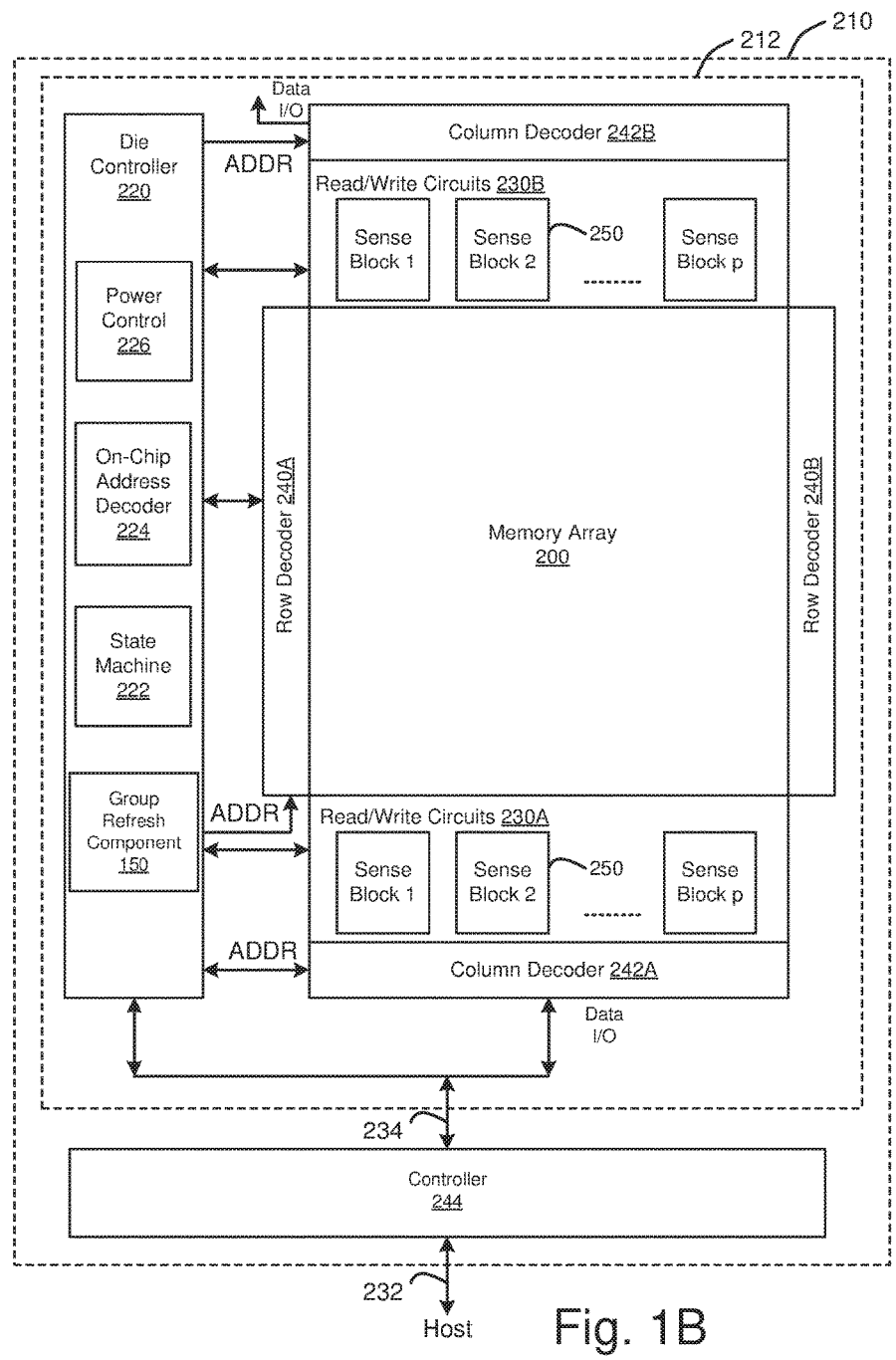
FIG. 1B is a schematic block diagram illustrating another embodiment of a system for performing a group read refresh.

FIG. 1B illustrates an embodiment of a non-volatile storage device 210 that may include one or more memory die or chips 212. Memory die 212, in some embodiments, includes an array (two-dimensional or three dimensional) of memory cells 200, die controller 220, and read/write circuits 230A/230B. In one embodiment, access to the memory array 200 by the various peripheral circuits is implemented in a symmetric fashion, on opposite sides of the array, so that the densities of access lines and circuitry on each side are reduced by half. The read/write circuits 230A/230B, in a further embodiment, include multiple sense blocks 250 which allow a page of memory cells to be read or programmed in parallel.

The memory array 200, in various embodiments, is addressable by word lines via row decoders 240A/240B and by bit lines via column decoders 242A/242B. In some embodiments, a controller 244 is included in the same memory device 210 (e.g., a removable storage card or package) as the one or more memory die 212. Commands and data are transferred between the host and controller 244 via lines 232 and between the controller and the one or more memory die 212 via lines 234. One implementation can include multiple chips 212.

Die controller 220, in one embodiment, cooperates with the read/write circuits 230A/230B to perform memory operations on the memory array 200. The die controller 220, in certain embodiments, includes a group refresh component 150, a state machine 222, and an on-chip address decoder 224. In one embodiment, the state machine 222 comprises at least a portion of the group refresh component 150. In a further embodiment, the controller 244 comprises at least a portion of the group refresh component 150.

The group refresh component 150, in one embodiment, is configured to perform an operation on a selected memory block of a plurality of memory blocks coupled to the same control line, determine a type of read refresh to perform, and as part of the operation, perform the type of read refresh on an unselected memory block of the plurality of memory blocks.

The state machine 222, in one embodiment, provides chip-level control of memory operations. The on-chip address decoder 224 provides an address interface to convert between the address that is used by the host or a memory controller to the hardware address used by the decoders 240A, 240B, 242A, 242B. In certain embodiments, the state machine 222 includes an embodiment of the group refresh component 150. The group refresh component 150, in certain embodiments, is embodied as software in a device driver, hardware in a device controller 244, and/or hardware in a die controller 220 and/or state machine 222.

In one embodiment, one or any combination of die controller 220, group refresh component 150, decoder circuit 224, state machine circuit 222, decoder circuit 242A, decoder circuit 242B, decoder circuit 240A, decoder circuit 240B, read/write circuits 230A, read/write circuits 230B, and/or controller 244 can be referred to as one or more managing circuits.

Figure 2:
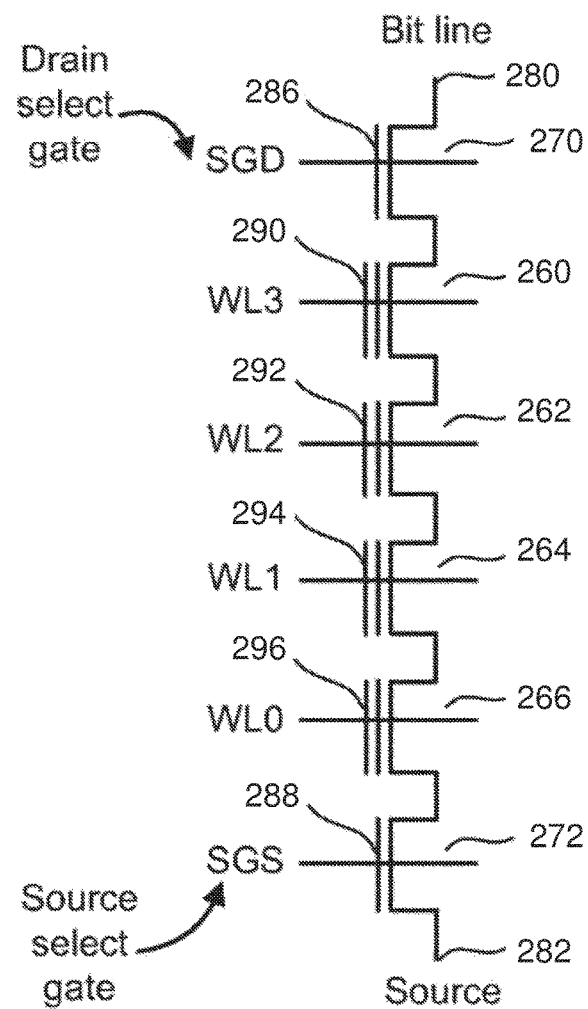
FIG. 2 is a schematic block diagram illustrating one embodiment of a string of storage cells.

FIG. 2 depicts one embodiment of a NAND string comprising a plurality of storage elements. The NAND string depicted in FIG. 2, in some embodiments, includes four transistors 260, 262, 264, 266 connected in series and located between a first select transistor 270 and a second select transistor 272. In some embodiments, a transistor 260, 262, 264, 266 includes a control gate and a floating gate. A control gate 290, 292, 294, 296, in one embodiment, is connected to, or comprises a portion of, a word line. In a further embodiment, a transistor 260, 262, 264, 266 is a storage element, storage cell, or the like, also referred to as a memory cell. In some embodiments, a storage element may include multiple transistors 260, 262, 264, 266.

The first select transistor 270, in some embodiments, gates/connects the NAND string connection to a bit line 280 via a drain select gate SGD. The second select transistor 272, in certain embodiments, gates/connects the NAND string connection to a source line 282 via a source select gate SGS. The first select transistor 270, in a further embodiment, is controlled by applying a voltage to a corresponding select gate 286. The second select transistor 272, in some embodiments, is controlled by applying a voltage to corresponding select gate 288.

As shown in FIG. 2, the source line 282, in one embodiment, is connected to the sources of each transistor/storage cell 260, 262, 264, 266 in the NAND string. The NAND string, in some embodiments, may include some storage elements 260, 262, 264, 266 that have been programmed and some storage elements 260, 262, 264, 266 that have not been programmed. As described in more detail below, the group refresh component 150 performs a read refresh on certain unselected memory blocks to change a read state of the unselected memory blocks as described below.

Figure 3:
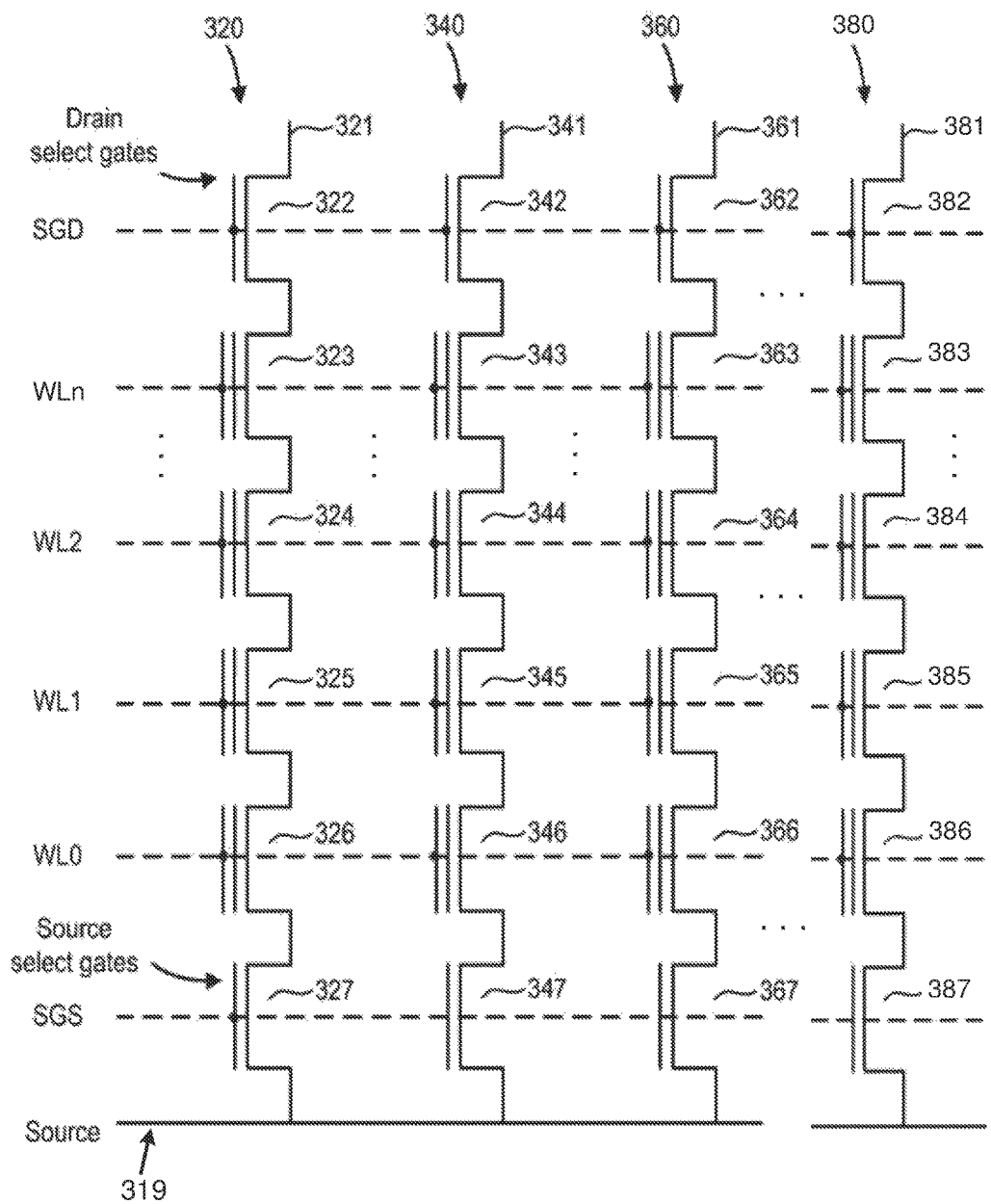
FIG. 3 is a schematic block diagram illustrating one embodiment of an array of storage cells.

FIG. 3 is a circuit diagram depicting a plurality of NAND strings 320, 340, 360, 380. An architecture for a flash memory system using a NAND structure may include several NAND strings 320, 340, 360, 380. For example, FIG. 3 illustrates NAND strings 320, 340, 360, 380 in a memory array 200 that includes multiple NAND strings 320, 340, 360, 380. In the depicted embodiment, each NAND string 320, 340, 360, 380 includes drain select transistors 322, 342, 362, 382, source select transistors 327, 347, 367, 387, and storage elements 323-326, 343-346, 363-366, 383-386. While four storage elements 323-326, 343-346, 363-366, 383-386 per NAND string 320, 340, 360, 380 are illustrated for simplicity, some NAND strings 320, 340, 360, 380 can include any number of storage elements, e.g., thirty-two, sixty-four, or the like storage elements.

NAND strings 320, 340, 360, 380, in one embodiment, are connected to a source line 319 by source select transistors 327, 347, 367, 387. A selection line SGS may be used to control the source side select transistors. The various NAND strings 320, 340, 360, 380, in one embodiment, are connected to bit lines 321, 341, 361, 381 by drain select transistors 322, 342, 362, 382. The drain select transistors 322, 342, 362, 382 may be controlled by a drain select line SGD. In some embodiments, the select lines do not necessarily need to be in common among the NAND strings 320, 340, 360, 380; that is, different select lines can be provided for different NAND strings 320, 340, 360, 380.

As described above, each word line WL0-WLn comprises one or more storage elements 323-383, 324-384, 325-385, 326-386. In the depicted embodiment, each bit line 321, 341, 361, 381 and the respective NAND string 320, 340, 360, 380 comprise the columns of the memory array 200, storage block, erase block, or the like. The word lines WL0-WLn, in some embodiments, comprise the rows of the memory array 200, storage block, erase block, or the like. Each word line WL0-WLn, in some embodiments, connects the control gates of each storage element 323-383, 324-384, 325-385, 326-386 in a row. Alternatively, the control gates may be provided by the word lines WL0-WLn themselves. In some embodiments, a word line WL0-WLn may include tens, hundreds, thousands, millions, or the like of storage elements 323-383, 324-384, 325-385, 326-386.

In one embodiment, each storage element 323-326, 343-346, 363-366, 383-386 is configured to store data. For example, when storing one bit of digital data, the range of possible threshold voltages ("VTH") of each storage element 323-326, 343-346, 363-366, 383-386 may be divided into two ranges which are assigned logical data "1" and "0." In one example of a NAND type flash memory, the VTH may be negative after the storage elements 323-326, 343-346, 363-366, 383-386 are erased, and defined as logic "1." In one embodiment, the VTH after a program operation is positive and defined as logic "0."

When the VTH is negative and a read is attempted, in some embodiments, storage elements 323-326, 343-346, 363-366, 383-386 will turn on to indicate logic "1" is being stored. When the VTH is positive and a read operation is attempted, in a further embodiment, a storage element will not turn on, which indicates that logic "0" is stored. Each storage element 323-383, 324-384, 325-385, 326-386 may also store multiple levels of information, for example, multiple bits of digital data. In such an embodiment, the range of VTH value is divided into the number of levels of data. For example, if four levels of information can be stored in each storage element 323-326, 343-346, 363-366, 383-386, there will be four VTH ranges assigned to the data values "11", "10", "01", and "00."

In one example of a NAND type memory, the VTH after an erase operation may be negative and defined as "11." Positive VTH values may be used for the states of "10", "01", and "00." In one embodiment, the specific relationship between the data programmed into the storage elements 323-326, 343-346, 363-366, 383-386 and the threshold voltage ranges of the storage elements 323-326, 343-346, 363-366, 383-386 depends upon the data encoding scheme adopted for the storage elements 323-326, 343-346, 363-366, 383-386.

In some embodiments, portions of the storage elements 323-326, 343-346, 363-366, 383-386 may be defective. In such an embodiment, the group refresh component 150 may manage which portions of the storage elements 323-326, 343-346, 363-366, 383-386 have a read refresh performed on them.

Figure 4:
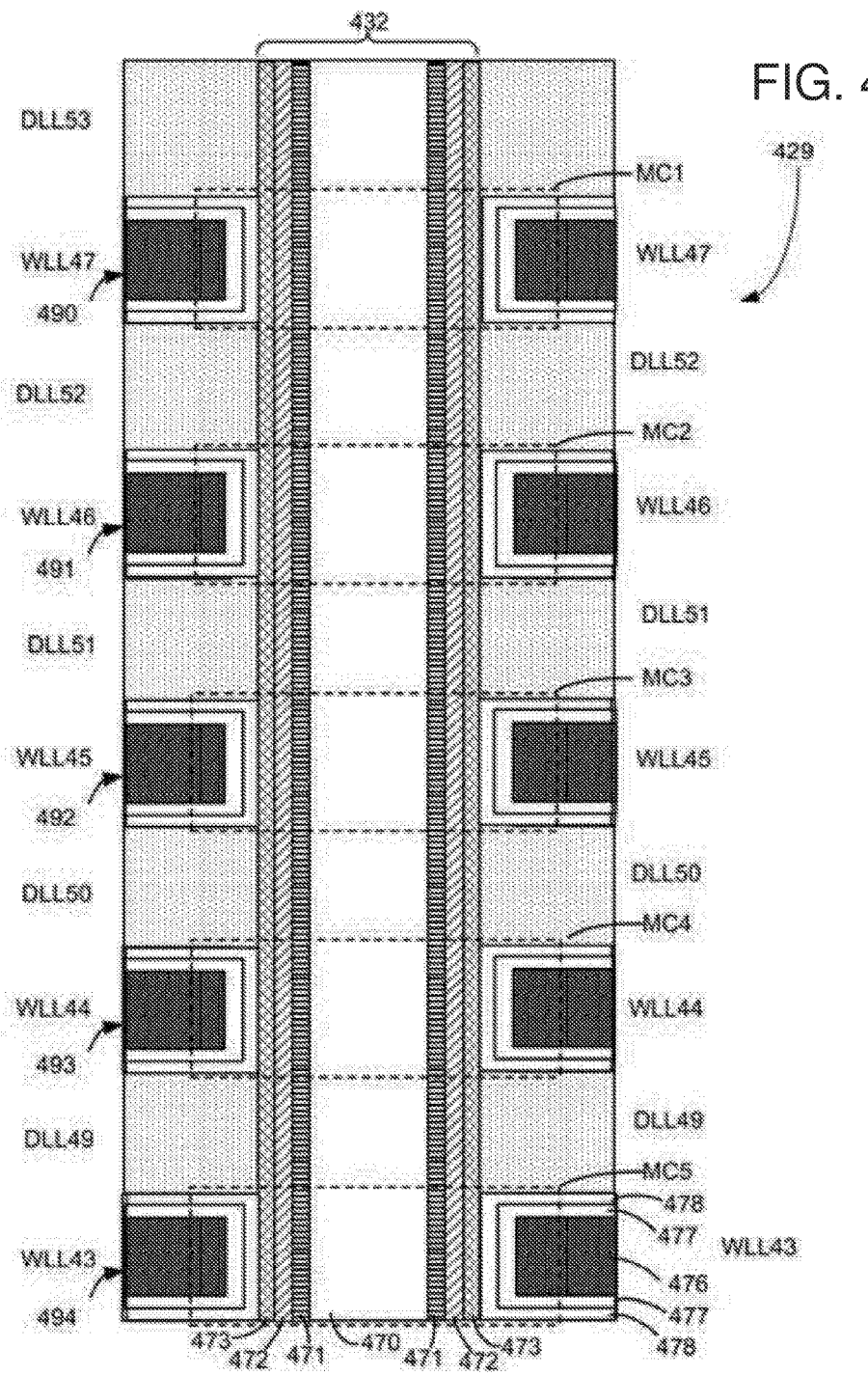
FIG. 4 illustrates one embodiment of a 3D, vertical NAND flash memory structure.

FIG. 4 illustrates one embodiment of a cross-sectional view of a 3D, vertical NAND flash memory structure 429 or string 429. In one embodiment, the vertical column 432 is round and includes four layers; however, in other embodiments more or less than four layers can be included and other shapes can be used (e.g., a "U" shape instead of an "I" shape or the like). In one embodiment, a vertical column 432 includes an inner core layer 470 that is made of a dielectric, such as SiO2. Other materials can also be used. Surrounding inner core 470 is polysilicon channel 471. Materials other than polysilicon can also be used. Note that it is the channel 471 that connects to the bit line. Surrounding channel 471 is a tunneling dielectric 472. In one embodiment, tunneling dielectric 472 has an ONO structure. Surrounding tunneling dielectric 472 is a shared charge trapping layer 473, such as (for example) Silicon Nitride. Other materials and structures can also be used. The technology described herein is not limited to any particular material or structure.

FIG. 4 depicts dielectric layers DLL49, DLL50, DLL51, DLL52 and DLL53, as well as word line layers WLL43, WLL44, WLL45, WLL46, and WLL47. Each of the word line layers includes a word line region 476 surrounded by an aluminum oxide layer 477, which is surrounded by a blocking oxide (SiO2) layer 478. The physical interaction of the word line layers with the vertical column forms the memory cells. Thus, a memory cell, in one embodiment, comprises channel 471, tunneling dielectric 472, charge trapping layer 473 (e.g., shared with other memory cells), blocking oxide layer 478, aluminum oxide layer 477 and word line region 476. In some embodiments, the blocking oxide layer 478 and aluminum oxide layer 477, may be replaced by a single layer of material with insulating properties or by more than 2 layers of different material with insulating properties. Furthermore, the materials used are not limited to silicon dioxide (SiO2) or aluminum oxide. For example, word line layer WLL47 and a portion of vertical column 432 comprise a memory cell MC1. Word line layer WLL46 and a portion of vertical column 432 comprise a memory cell MC2. Word line layer WLL45 and a portion of vertical column 432 comprise a memory cell MC3. Word line layer WLL44 and a portion of vertical column 432 comprise a memory cell MC4. Word line layer WLL43 and a portion of vertical column 432 comprise a memory cell MC5. In other architectures, a memory cell may have a different structure; however, the memory cell would still be the storage unit.

When a memory cell is programmed, electrons are stored in a portion of the charge trapping layer 473 which is associated with the memory cell. These electrons are drawn into the charge trapping layer 473 from the channel 471, through the tunneling dielectric 472, in response to an appropriate voltage on word line region 476. The threshold voltage (Vth) of a memory cell is increased in proportion to the amount of stored charge. In one embodiment, the programming is achieved through Fowler-Nordheim tunneling of the electrons into the charge trapping layer. During an erase operation, the electrons return to the channel or holes are injected into the charge trapping layer to recombine with electrons. In one embodiment, erasing is achieved using hole injection into the charge trapping layer via a physical mechanism such as gate induced drain leakage (GIDL).

Storage cells in the same location or position in different memory structures 429 (e.g., different NAND strings 429) on different bit lines, in certain embodiments, may be on the same word line. Each word line may store one page of data, such as when 1-bit of data is stored per cell (SLC); two pages of data, such as when 2-bits of data are stored per cell (MLC); three pages of data, such as when 3-bits of data are stored per cell (TLC); four pages of data, such as when 4-bits of data are stored per cell (QLC); or another number of pages of data.

In the depicted embodiment, a vertical, 3D NAND flash memory structure 429 comprises an "I" shaped memory structure 429. In other embodiments, a vertical, 3D NAND flash memory structure 429 may comprise a "U" shaped structure, or may have another vertical and/or stacked architecture. In certain embodiments, four sets of strings 429 (e.g., four sets of 48 word lines, or another predefined number of word lines) may form an erase block, while in other embodiments, fewer or more than four sets of strings 429 may form an erase block. As may be appreciated, any suitable number of storage cells may be part of a single string 429. In one embodiment, a single string 429 includes 48 storage cells.

Figure 5:
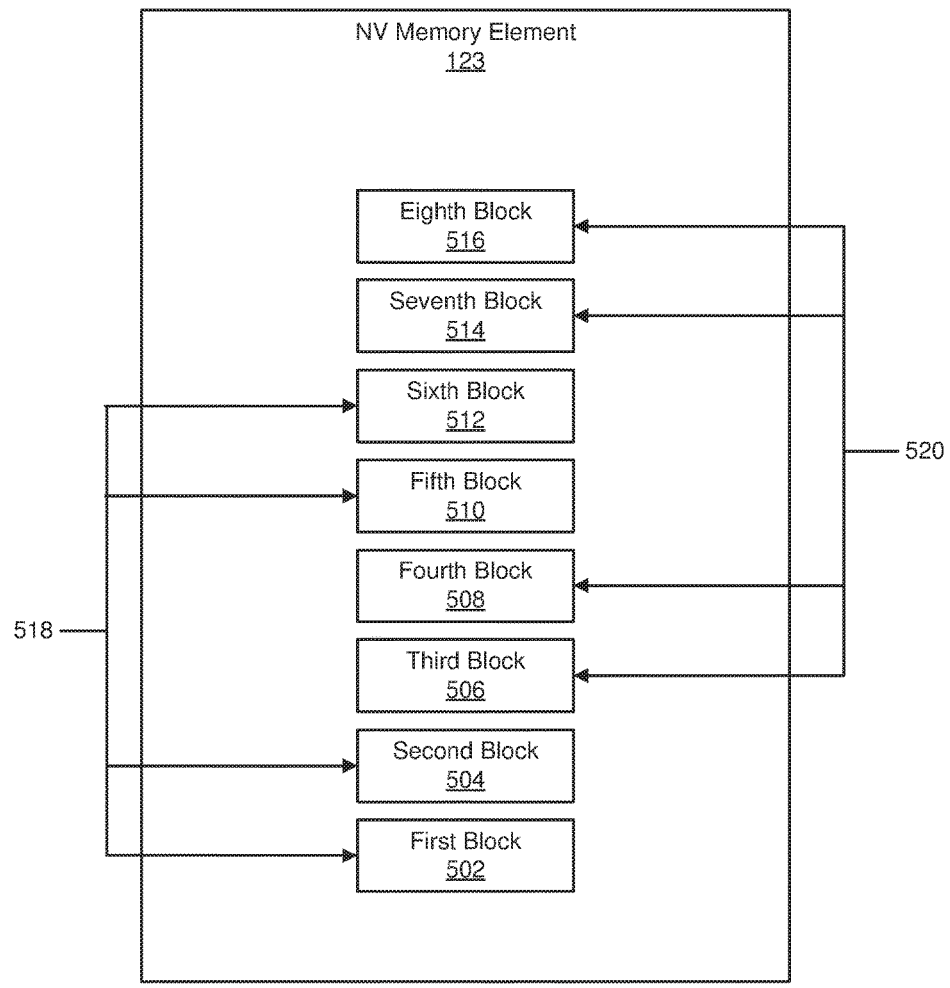
FIG. 5 is a schematic block diagram illustrating one embodiment of a non-volatile memory element including memory blocks.

FIG. 5 is a schematic block diagram illustrating one embodiment of the non-volatile memory element 123 including memory blocks. The non-volatile memory element 123 may include any suitable number of memory blocks. In the illustrated embodiment, the non-volatile memory element 123 includes a first block 502, a second block 504, a third block 506, a fourth block 508, a fifth block 510, a sixth block 512, a seventh block 514, and an eighth block 516. In some embodiments, the memory blocks are grouped together into memory block groups that share a control line. Specifically, in the embodiment of FIG. 5, a first control line 518 is used to provide a control signal (e.g., control voltage) to a first memory block group that includes the first block 502, the second block 504, the fifth block 510, and the sixth block 512. Moreover, a second control line 520 is used to provide a control signal (e.g., control voltage) to a second memory block group that includes the third block 506, the fourth block 508, the seventh block 514, and the eighth block 516. In some embodiments, the first memory block group and/or the second memory block group may be considered Even-Odd Combined (EOC) groups. Although only two memory block groups are illustrated, the non-volatile memory element 123 may include any number of memory block groups.

As may be appreciated, because the memory blocks in a memory block group share a control line (e.g., physical control line), the memory blocks in the memory block group may be affected by signals supplied on the control line. For example, in one embodiment, one of the memory blocks in a memory block group may be a "selected" memory block and the remaining memory blocks in a memory block group may be "unselected" memory blocks. While the memory block group is being accessed, a signal may be supplied to the control line that is provided to both the selected memory block and the unselected memory blocks. In certain embodiments, the signal supplied to the control line may cause the unselected memory blocks to be placed into a "first read state." This may occur because the unselected memory blocks have a path to discharge through the control line. The first read state may be undesirable because there may be a higher bit error rate produced while memory blocks are in the first read state. Accordingly, the unselected memory blocks may be transitioned to a "second read state" to result in a lower bit error rate. As used herein, a "first read state" may refer to a memory state at an initial read, a read state right after a memory device is powered after being powered down, and/or a read state of unselected blocks after a read, erase, and/or program is performed on a selected block. Moreover, as used herein, a "second read state" may refer to a memory state at a read after an initial read, a read after programming, and/or a read after a program verify. In a "first read state" a threshold voltage distribution may be different than in a "second read state." The "first read state" may have a higher bit error rate than the "second read state." Moreover, the "first read state" may exhibit erratic behavior and/or random reads that result in the higher bit error rate.

Figure 6:
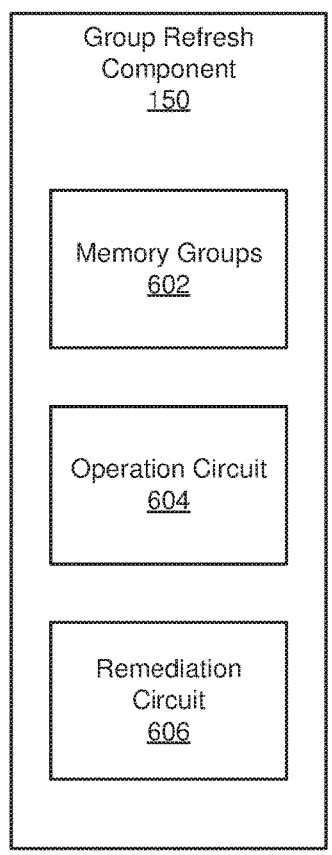
FIG. 6 is a schematic block diagram illustrating one embodiment of a group refresh component.

FIG. 6 depicts one embodiment of a group refresh component 150. The group refresh component 150 may be substantially similar to the group refresh component 150 described above with regard to FIGS. 1A, 1B, 2, and/or 3. In general, as described above, the group refresh component 150 performs an operation on a selected memory group of a plurality of memory groups, and performs a countermeasure operation on an unselected memory group of the plurality of memory groups in response to the operation on the selected memory group. Accordingly, the group refresh component 150 may facilitate performing a group read refresh. In the depicted embodiment, the group refresh component 150 includes memory groups 602, an operation circuit 604, and a remediation circuit 606. In various embodiments, the memory groups 602, the operation circuit 604, and the remediation circuit 606 may be part of a single integrated circuit chip.

In one embodiment, the memory groups 602 (e.g., memory blocks) may be may be any suitable groups of memory cells (e.g., storage locations). In certain embodiments, the memory groups 602 may be similar to the memory blocks described in relation to FIG. 5. In various embodiments, the memory groups 602 may be manufactured in such a manner that operations performed on one or more memory groups 602 affect a state of one or more other memory groups on which an operation is not performed.

In certain embodiments, the operation circuit 604 performs an operation on a selected memory group of the memory groups 602. The operation circuit 604 may perform any suitable type of operation, such as an erase operation, a program operation, a read operation, a write operation, and/or a verify operation. Moreover, the operation circuit 604 may perform the operation on the selected memory group in response to receiving a command to perform the operation. The command may be received from a controller, such as the non-volatile memory media controller 126. The selected memory group may be a memory group that is selected by a select signal supplied to the selected memory group. In various embodiments, the operation circuit 604 performing the operation on the selected memory group may put an unselected memory group in a different read state (e.g., a first read state, a degraded read state) than the selected memory group (e.g., the selected memory group may be in a second read state or a nominal read state). In certain embodiments, the operation circuit 604 performing the operation on the selected memory group may put the selected memory group in a second read state (e.g., a nominal read state).

In some embodiments, the remediation circuit 606 performs a countermeasure operation (e.g., read, read refresh, soft program, any operation that results in the unselected memory group shifting from the first read state to the second read state, etc.) on an unselected memory group of the memory groups 602 in response to the operation on the selected memory group. In various embodiments, the remediation circuit 606 may perform a countermeasure operation on multiple unselected memory groups of the memory groups 602 in response to the operation on the selected memory group. In one embodiment, the remediation circuit 606 performing the countermeasure operation on one or more unselected memory groups puts the one or more unselected memory group groups in a same read state (e.g., second read state) as the selected memory group. In certain embodiments, the selected memory group and the one or more unselected memory groups are coupled to a single control line. In such embodiments, the one or more unselected memory groups may include all memory groups coupled to the single control line except the selected memory group. For example, referring to the first memory block group of FIG. 5, if the first block 502 is a selected memory block, the second block 504, the fifth block 510, and the sixth block 512 may be the one or more unselected memory blocks.

In some embodiments, performing the countermeasure operation on the one or more unselected memory groups may include performing a read on the one or more unselected memory groups without returning information stored on the one or more unselected memory groups (e.g., not populating a data latch). In various embodiments, performing the read on the one or more unselected memory groups may include applying a read voltage to the one or more unselected memory groups without sensing data stored on the one or more unselected memory groups. In certain embodiments, performing the read on the one or more unselected memory groups may include performing a read refresh on the one or more unselected memory groups. In such embodiments, performing a read refresh on the one or more unselected memory groups may include performing the read refresh on one or more pages of the one or more unselected memory groups. In one embodiment, performing the read on the one or more unselected memory groups may include performing applying a read voltage to the one or more unselected memory groups for a predetermined duration and/or waiting a predetermined duration prior to performing an operation on a memory group of the one or more unselected memory groups.

In some embodiments, the remediation circuit 606 performing a countermeasure operation on an unselected memory group of the memory groups 602 in response to the operation on the selected memory group may include: the remediation circuit 606 performing the countermeasure operation on the unselected memory group directly in response to detecting completion of the operation; the remediation circuit 606 performing the countermeasure operation on the unselected memory group as part of the operation (e.g., the operation may be an initial portion of the operation, and the countermeasure operation may be a final portion of the operation); the remediation circuit 606 automatically performing the countermeasure operation on the unselected memory group directly after completion of the operation; and/or the remediation circuit 606 performing the countermeasure operation on the unselected memory group in response to receiving a command to perform the countermeasure operation on the unselected memory group (the command may be sent in response to completion of the operation). In certain embodiments, the remediation circuit 606 may perform a countermeasure operation (e.g., read refresh) on the selected memory group in addition to performing the countermeasure operation on the unselected memory group. In such embodiments, the countermeasure operation on the selected memory group may be performed at substantially the same time as the countermeasure operation on the unselected memory group. In various embodiments, performing the countermeasure operation on the one or more unselected memory groups may increase a time to complete the operation. In some embodiments, performing the countermeasure operation on the one or more unselected memory groups may not increase the time to complete the operation because the countermeasure operation is performed as a background task.

Figure 7:
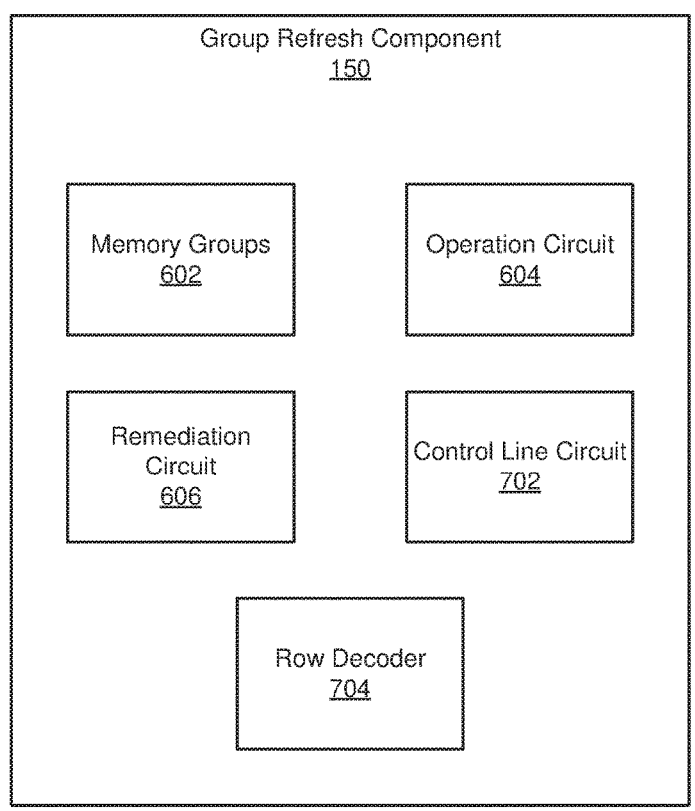
FIG. 7 is a schematic block diagram illustrating another embodiment of a group refresh component.

FIG. 7 depicts another embodiment of a group refresh component 150. The group refresh component 150 may be substantially similar to the group refresh component 150 described above with regard to FIGS. 1A, 1B, 2, 3, and/or 6. In general, as described above, the group refresh component 150 performs an operation on a selected memory block of a plurality of memory blocks coupled to the same control line, determines a type of read refresh to perform, and as part of the operation, performs the type of read refresh on an unselected memory block of the plurality of memory blocks. Accordingly, the group refresh component 150 may facilitate performing a group read refresh. In the depicted embodiment, the group refresh component 150 includes memory groups 602, an operation circuit 604, and a remediation circuit 606. The memory groups 602, the operation circuit 604, and the remediation circuit 606 may be substantially similar to the memory groups 602, the operation circuit 604, and the remediation circuit 606 described in relation to FIG. 6. Moreover, the group refresh component 150 includes a control line circuit 702 and a row decoder 704.

In one embodiment, the control line circuit 702 is a circuit that electrically couples the memory groups 602 together and may be used to provide a control voltage to all of the memory groups 602 at the same time (e.g., control line 518, control line 520). As may be appreciated, by having the memory groups 602 electrically coupled together, the memory groups 602 may all be affected by a control voltage provided via the control line circuit 702. In some embodiments, the control voltage opens one or more common passing gates (e.g., a transistor or other switch configured to allow or block electric current from reaching word lines of an erase block) for the memory groups 602 (e.g., one or more passing gates receiving the same control signal) and the operation circuit 604 provides a selected memory group an operation voltage for the operation and provides the unselected memory group a bias voltage during the operation (e.g., through one or more common passing gates to word lines of the memory groups).

For example, in one embodiment, each erase block in a memory group 602 comprises one or more passing gates (e.g., at least one passing gate per erase block, a passing gate for each word line of each erase block, or the like) coupled to the same control line 518, 520 (e.g., from a common row decoder 704 or the like for erase blocks of the memory group 602) such that the one or more passing gates for each of the erase blocks in the memory group 602 are fully on (e.g., allowing current to flow to the word lines of the erase blocks) when any one of the erase blocks is selected for a memory operation, and are fully off (e.g., blocking current from flowing to the word lines of the erase blocks) when none of the erase blocks are selected. In certain embodiments, with passing gates fully on and providing current to word lines for each erase block in a memory group 602, the operation circuit 604 cooperates with the control line circuit 702 to provide an operation voltage to word lines of the erase block selected for an operation (e.g., an erase voltage, a program voltage, a read voltage, or the like) and to provide a bias voltage (e.g., with a lower magnitude than the operation voltage) to word lines of other erase blocks of the memory group 602 (e.g., which are not selected for the operation). Word lines of other memory groups 602, in one embodiment, receive little or no current, since their passing gates are fully off.

In certain embodiments, the bias voltage may have a lower magnitude than the operation voltage. For example, for erase operations, the erase voltage may be lower than the bias voltage because the erase voltage has a high magnitude negative polarity voltage, but the bias voltage may still have a lower magnitude (e.g., absolute value voltage level). As another example, for program operations the program voltage may be higher than the bias voltage and have a greater magnitude because the program voltage has a high magnitude positive polarity voltage. In various embodiments, the row decoder 704 is shared by each memory group of the memory groups 602.

Figure 8:
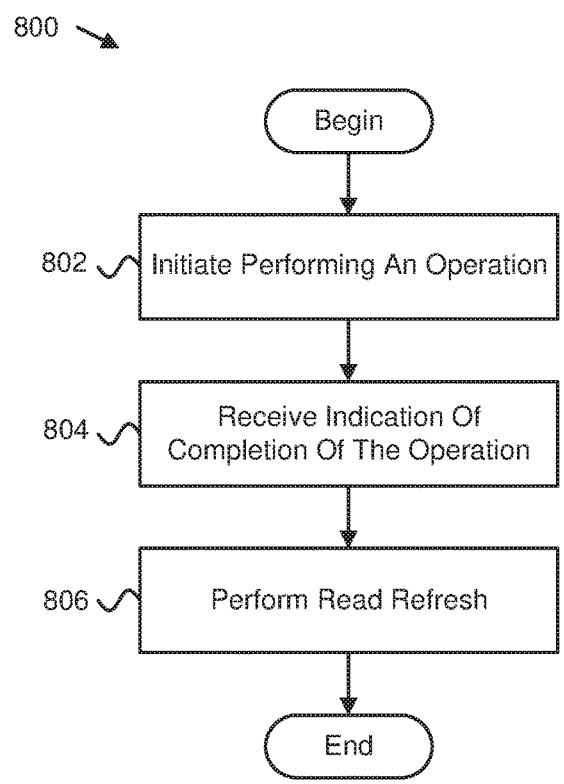
FIG. 8 is a schematic flow chart diagram illustrating one embodiment of a method for performing a group read refresh.

FIG. 8 is a schematic flow chart diagram illustrating one embodiment of a method 800 for performing a group read refresh. The method 800 begins, and the group refresh component 150 initiates 802 performing an operation on a selected memory block of a set of EOC blocks. In one embodiment, the group refresh component 150 receives 804 an indication of completion of the operation. In certain embodiments, the remediation circuit 606 performs 806 a read refresh on one or more unselected memory blocks of the EOC blocks, and the method 800 ends.

Figure 9:
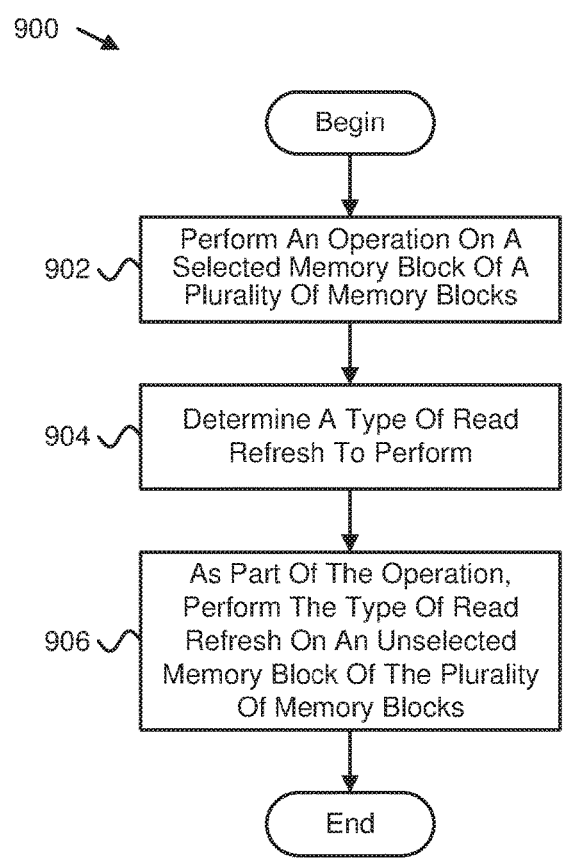
FIG. 9 is a schematic flow chart diagram illustrating another embodiment of a method for performing a group read refresh.

FIG. 9 is a schematic flow chart diagram illustrating another embodiment of a method 900 for performing a group read refresh. The method 900 begins, and the operation circuit 604 performs 902 an operation on a selected memory block of a plurality of memory blocks coupled to the same control line. In various embodiments, the group refresh component 150 determines 904 a type of read refresh to perform. In one embodiment, the remediation circuit 606, as part of the operation, performs 906 the type of read refresh on an unselected memory block of the plurality of memory blocks, and the method 900 ends. The type of read refresh may be any suitable type of read refresh, such as: a read refresh that performs a read on the unselected memory blocks serially; a read that performs a read on the unselected memory blocks in parallel, a read that performs a read on all memory blocks serially; and/or a read that performs a read on all memory blocks in parallel. In some embodiments, the type of read refresh may be a D2h read refresh that performs a read refresh on a quarter of a die. In various embodiments, the type of read refresh may be a CFh read refresh that performs a read refresh using a long read command to precondition a block for a longer time period than a normal sense time period.

A means for performing an operation on a selected group of memory cells of a plurality of memory cells using an operation voltage level for the selected group of memory cells and a different voltage level for an unselected group of memory cells of the plurality of memory cells, in various embodiments, may include one or more of a group refresh component 150, an operation circuit 604, a die controller 220, a state machine 222, a sense amplifier 250, read/write circuits 230, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for performing an operation on a selected group of memory cells of a plurality of memory cells using an operation voltage level for the selected group of memory cells and a different voltage level for an unselected group of memory cells of the plurality of memory cells.

A means for means for performing a read refresh on an unselected group of memory cells of a plurality of memory cells in response to completing an operation, in certain embodiments, may include one or more of a group refresh component 150, an operation circuit 604, a remediation circuit 606, a die controller 220, a state machine 222, a sense amplifier 250, read/write circuits 230, a non-volatile memory device 120, a non-volatile memory medium controller 126, a non-volatile memory device interface 139, a host computing device 110, a device driver, a controller (e.g., a device driver, or the like) executing on a host computing device 110, a processor 111, an FPGA, an ASIC, other logic hardware, and/or other executable code stored on a computer readable storage medium. Other embodiments may include similar or equivalent means for performing a read refresh on an unselected group of memory cells of the plurality of memory cells in response to completing an operation.

The present disclosure may be embodied in other specific forms without departing from its spirit or essential characteristics. The described embodiments are to be considered in all respects only as illustrative and not restrictive. The scope of the disclosure is, therefore, indicated by the appended claims rather than by the foregoing description. All changes which come within the meaning and range of equivalency of the claims are to be embraced within their scope.

What is claimed is:

1. An apparatus comprising:
   a plurality of memory groups;
   an operation circuit that performs an operation on a selected memory group of the plurality of memory groups, wherein the operation transitions the selected memory group to a read state; and
   a remediation circuit that performs a countermeasure operation on an unselected memory group of the plurality of memory groups in response to the operation on the selected memory group, wherein the countermeasure operation places the unselected memory group into the read state.

2. The apparatus of claim 1, wherein the plurality of memory groups, the operation circuit, and the remediation circuit are part of a single integrated circuit chip.

3. The apparatus of claim 1, further comprising a control line circuit that provides a control voltage to the plurality of memory groups.

4. The apparatus of claim 3, wherein the control voltage opens a passing gate for each of the plurality of memory groups and the operation circuit provides the selected memory group an operation voltage for the operation and provides the unselected memory group a bias voltage during the operation, the bias voltage having a lower magnitude than the operation voltage.

5. The apparatus of claim 1, further comprising a row decoder shared by each memory group of the plurality of memory groups.

6. The apparatus of claim 1, wherein the remediation circuit performs the countermeasure operation on the unselected memory group without returning information stored on memory cells within the unselected memory group.

7. The apparatus of claim 1, wherein the operation circuit performing the operation on memory cells of the selected memory group puts the memory cells of the unselected memory group in a different read state than memory cells of the selected memory group.

8. The apparatus of claim 1, wherein the remediation circuit performs the countermeasure operation on the unselected memory group in response to detecting completion of the operation.

9. The apparatus of claim 1, wherein the remediation circuit performs the countermeasure operation on the unselected memory group in response to receiving a command to perform the countermeasure operation on the unselected memory group.

10. A system comprising:
a plurality of memory blocks coupled to the same control line;
a controller configured to:
perform an operation on a selected memory block of the plurality of memory blocks; and
as part of the operation, perform a read refresh on an unselected memory block of the plurality of memory blocks, wherein the read refresh puts the unselected memory block in a same read state as the selected memory block.

11. The system of claim 10, wherein the operation comprises one or more of an erase operation and a program operation.

12. The system of claim 10, wherein the read refresh comprises applying a read voltage to the unselected memory block without sensing data stored on the unselected memory block.

13. The system of claim 10, wherein an initial portion of the operation places the unselected memory block in a degraded read state, and the read refresh transitions the unselected memory block to a nominal read state.

14. The system of claim 10, wherein an initial portion of the operation places the selected memory block in a nominal read state.

15. The system of claim 10, wherein performing the read refresh on the unselected memory block comprises performing the read refresh on at least one page of the unselected memory block.

16. The system of claim 10, wherein performing the read refresh on the unselected memory block comprises applying a read voltage to the unselected memory block for a predetermined duration.

17. The system of claim 10, wherein performing the read refresh on the unselected memory block comprises waiting a predetermined duration prior to performing an operation on a memory block of the unselected memory block.

18. The system of claim 10, wherein the controller is configured to, as part of the operation, perform the read refresh on the selected memory block.

19. An apparatus comprising:
means for performing an operation on a selected group of memory cells of a plurality of memory cells using an operation voltage level for the selected group of memory cells and a different voltage level for an unselected group of memory cells of the plurality of memory cells, wherein the operation puts the unselected group of memory cells in a different read state than the selected group of memory cells; and
means for performing a read refresh on the unselected group of memory cells of the plurality of memory cells in response to completing the operation.

* * * * *